United States Patent
Butler

(10) Patent No.: US 7,515,494 B2
(45) Date of Patent: Apr. 7, 2009

(54) REFRESH PERIOD ADJUSTMENT TECHNIQUE FOR DYNAMIC RANDOM ACCESS MEMORIES (DRAM) AND INTEGRATED CIRCUIT DEVICES INCORPORATING EMBEDDED DRAM

(75) Inventor: Douglas B. Butler, Colorado, CO (US)

(73) Assignee: ProMOS Technologies PTE.Ltd, Singapore (SG)

( * ) Notice: Subject to any disclaimer, the term of this patent is extended or adjusted under 35 U.S.C. 154(b) by 323 days.

(21) Appl. No.: 11/559,791

(22) Filed: Nov. 14, 2006

(65) Prior Publication Data

US 2008/0112248 A1    May 15, 2008

(51) Int. Cl.
    *G11C 7/00*    (2006.01)
(52) U.S. Cl. .................. 365/222; 365/200; 365/185.2
(58) Field of Classification Search .................. 365/222, 365/200, 185.2, 185.14, 210, 189.08, 233.5, 365/189.03
    See application file for complete search history.

(56) References Cited

U.S. PATENT DOCUMENTS 4,905,198 A    2/1990    Oishi et al.

2003/0093615 A1 *   5/2003   De Jong ................. 711/106
2007/0033339 A1 *   2/2007   Best et al. ................ 711/106

OTHER PUBLICATIONS

Micron 128Mb: ×16, ×32 Mobile SDRAM, Micron Technology, Inc., 2001, p. 45.

* cited by examiner

*Primary Examiner*—Dang T Nguyen
(74) *Attorney, Agent, or Firm*—William J. Kubida; Hogan & Hartson LLP

(57) ABSTRACT

A DRAM refresh period adjustment technique based on the retention time of one or more unused memory cell(s) having characteristics very similar to the characteristics of the memory cell(s) with the shortest retention time used in the DRAM array. In a particular implementation of the technique of the present invention, the refresh period of a DRAM array is adjusted through the use of one or more of the DRAM bits that fail to meet the retention time requirement and have, therefore, been replaced by redundant DRAM bits. These replaced bits are then used to indicate the refresh period for the DRAM is the maximum it can be for the DRAM under then current operating conditions.

11 Claims, 3 Drawing Sheets

100B

200B

REFRESH PERIOD ADJUSTMENT TECHNIQUE FOR DYNAMIC RANDOM ACCESS MEMORIES (DRAM) AND INTEGRATED CIRCUIT DEVICES INCORPORATING EMBEDDED DRAM

BACKGROUND OF THE INVENTION

The present invention relates, in general, to the field of integrated circuit dynamic random access memories (DRAM) and those devices incorporating embedded DRAM. More particularly, the present invention relates to a DRAM refresh period adjustment technique which is based on the retention time of one or more unused memory cell(s) having characteristics very similar to the characteristics of the memory cell(s) with the shortest retention time used in the DRAM array.

Among the advantages of DRAMs over static random access memory (SRAM) and other integrated circuit data storage technologies is that their structure is very simple in that each cell typically comprises but a single small capacitor and an associated pass transistor. However, since these capacitors are made very small to provide maximum memory density and they can, under the best of circumstances, only hold a charge for a short period of time, they must be continually refreshed.

In essence, the circuitry to effectuate this refresh operation then serves to effectively read the contents of every cell in a DRAM array and refresh each one with a fresh "charge" before the charge leaks off and the data state is lost. In general, this "refreshing" is done by reading and restoring every "row" in the memory array whereby the process of reading and restoring the contents of each memory cell capacitor re-establishes the charge, and hence, the data state.

Another aspect of DRAM memory, whether stand-alone or embedded is that the frequency with which the cell contents must be refreshed is a function of, among other factors, device temperature. At lower operating temperatures, the memory need not be refreshed as frequently as at higher temperatures. Since this refresh operation adds to the overall latency in memory accesses, the ability to accurately sense the then current operating temperature and adjust the refresh of the memory to the lowest possible rate is highly desirable given the need for ever quicker "reads" and "writes" to the memory.

Therefore, it is known to adjust the refresh period of a DRAM memory by changing the refresh period based upon the sensed temperature of the device. Among the limitations of current techniques is that an assumption of the retention time of the cells as a function of temperature must first be made. In addition the circuitry for monitoring this temperature must be extremely accurate. Known techniques also do not take into consideration any operational voltage variation contribution to the cell retention time.

Currently DRAM memory is used extensively in mobile, battery-powered applications such as personal digital assistants (PDAs), cellular telephones, notebook computers and the like. In these applications, the DRAM is generally written to or read from (i.e. "active") for only a small portion of the time the device is powered up. When the DRAM array is not active, it is in standby mode. Nevertheless, the data in all or part of the DRAM must be retained even when in this standby mode. In order for this DRAM data to be retained, each data bit must be read and restored more frequently than the data retention time of the worst DRAM bit in the memory. This read and restore (or refresh) operation accounts for most of the power consumption of the DRAM in standby. It is therefore highly desirable to be able to adjust the refresh period to the maximum possible value for the DRAM under the DRAM's then current operational conditions in order to minimize power consumption.

Empirically, the retention time of DRAM bits typically fit a normal distribution and manufacturers of these chips generally utilize spare elements to replace anywhere from tens to thousands of the DRAM bits with the shortest refresh times. Since in this normal distribution it is the tail which is replaced, the replaced bits with the longest retention time will have characteristics very similar to the bits that were not replaced that have the shortest retention times. In this manner, the refresh period of the DRAM array is determined by the DRAM bit with the shortest retention time and the retention time of the replaced bits is not considered since the replaced bits are not ever written to or read from. It may be desirable to use this method only in standby or low-power modes of operation.

SUMMARY OF THE INVENTION

Disclosed herein is a DRAM refresh period adjustment technique which is based on the retention time of one or more unused memory cell(s) having characteristics very similar to the characteristics of the memory cell(s) with the shortest retention time used in the DRAM array. Stated another way, a particular technique of the present invention is implemented by adjusting the refresh period of a DRAM array through the use of one or more of the DRAM bits that fail to meet the retention time requirement and have, therefore, been replaced by redundant DRAM bits. These replaced bits are then used to indicate the refresh period for the DRAM is the maximum it can be for the DRAM under then current operating conditions.

In operation, at the time the DRAM is refreshed, a read of selected replaced bit(s) is undertaken. If the selected replaced bit(s) have retained data, the refresh period will be increased. If the selected replaced bit(s) have failed to retain data, the refresh period will then be decreased by a selected amount.

In accordance with another embodiment of the present invention, a further refresh period adjustment technique is disclosed in which bits that have the same retention time as bits that were not replaced can be used as indicator bits. These bits can be identified during testing and replaced with spare bits at repair. They are then refreshed at a refresh period that is a selected time (or percentage) longer than the refresh period of the DRAM. If the monitor (or indicator) bits fail, the refresh period is shortened. Alternatively, if the monitor bits pass, the refresh period is lengthened.

Particularly disclosed herein in a first embodiment of the technique of the present invention is a DRAM array refresh period adjustment method which comprises determining the retention time of at least some of the DRAM array bits, replacing those DRAM array bits with the shortest retention time with spare bits and establishing indicator bits as those replaced DRAM array bits having a somewhat shorter retention time as those DRAM array bits not replaced. The method may further comprise refreshing the DRAM array bits in accordance with a predetermined refresh time period, determining a state of the indicator bits and increasing the refresh time period of the DRAM array bits to an increased refresh time period if the indicator bits have maintained their data state and decreasing the refresh time period of the DRAM array bits to a decreased refresh time period if the indicator bits have not maintained their data state.

Also particularly disclosed herein in another embodiment of the technique of the present invention is a DRAM array refresh period adjustment method which comprises determining the retention time of at least some of the DRAM array bits, replacing those DRAM array bits with the shortest retention time with spare bits and establishing indicator bits as those replaced DRAM array bits having a substantially equal retention time as those DRAM array bits not replaced. The method may further comprise refreshing the DRAM array bits in accordance with a first predetermined refresh time period, initializing a second longer predetermined refresh time period substantially concurrently with an initialization of the first predetermined refresh time period, determining a state of the indicator bits upon elapse of the second predetermined refresh time period and increasing the first and second predetermined refresh time periods of the DRAM array bits to an increased refresh time period if the indicator bits have maintained their data state and decreasing the first and second predetermined refresh time periods of the DRAM array bits to a decreased refresh time period if the indicator bits have not maintained their data state.

Still further disclosed herein is a DRAM array refresh period adjustment method which comprises replacing selected ones of the DRAM array bits having a shortest retention time with spare DRAM array bits, utilizing at least one or more of the replaced DRAM bits having a retention time similar to a shortest retention time of the DRAM array bits not replaced as one or more indicator bits and setting the refresh time period for the DRAM array based on the retention time of the one or more indicator bits.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1A:
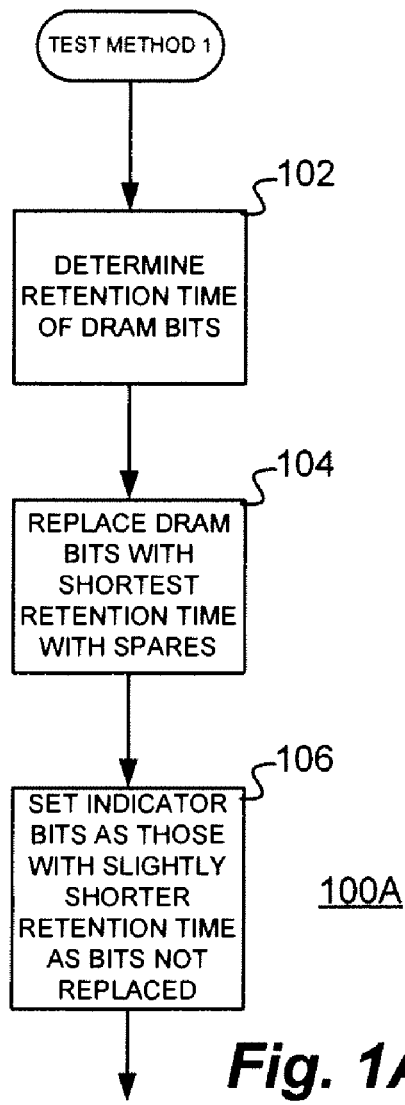
FIG. 1A is a representative flowchart for a possible test methodology in accordance with the refresh adjustment technique of the present invention.

With reference now to FIG. 1A, a representative flowchart for a possible test methodology 100A in accordance with the refresh adjustment technique of the present invention is shown.

The test methodology 100A commences by determining the retention time of the DRAM bits at step 102. At step 104, the DRAM bits with the shortest retention times are replaced with spare bits and, at step 106, indicator bits are set as those with a slightly shorter retention time than the bits not replaced in the preceding step 104.

Figure 1B:
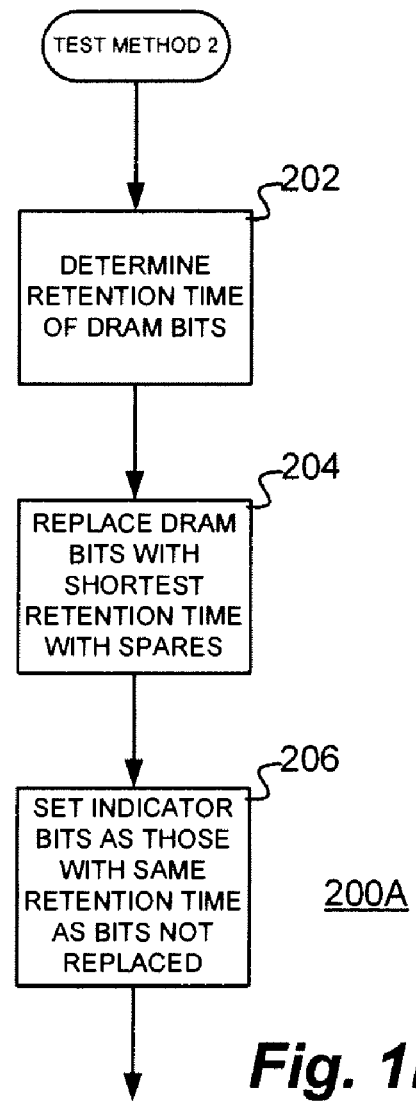
FIG. 1B is another representative flowchart for a further possible test methodology in accordance with the refresh adjustment technique of the present invention.

With reference additionally now to FIG. 1B, another representative flowchart for a further possible test methodology 200A in accordance with the refresh adjustment technique of the present invention is shown.

As before, the test methodology 200A commences by determining the retention time of the DRAM bits at step 202. Again, at step 204, the DRAM bits with the shortest retention times are replaced with spare bits. However, at step 206, indicator bits are now set as those with the same retention time as the bits not replaced in the preceding step 204.

Figure 2A:
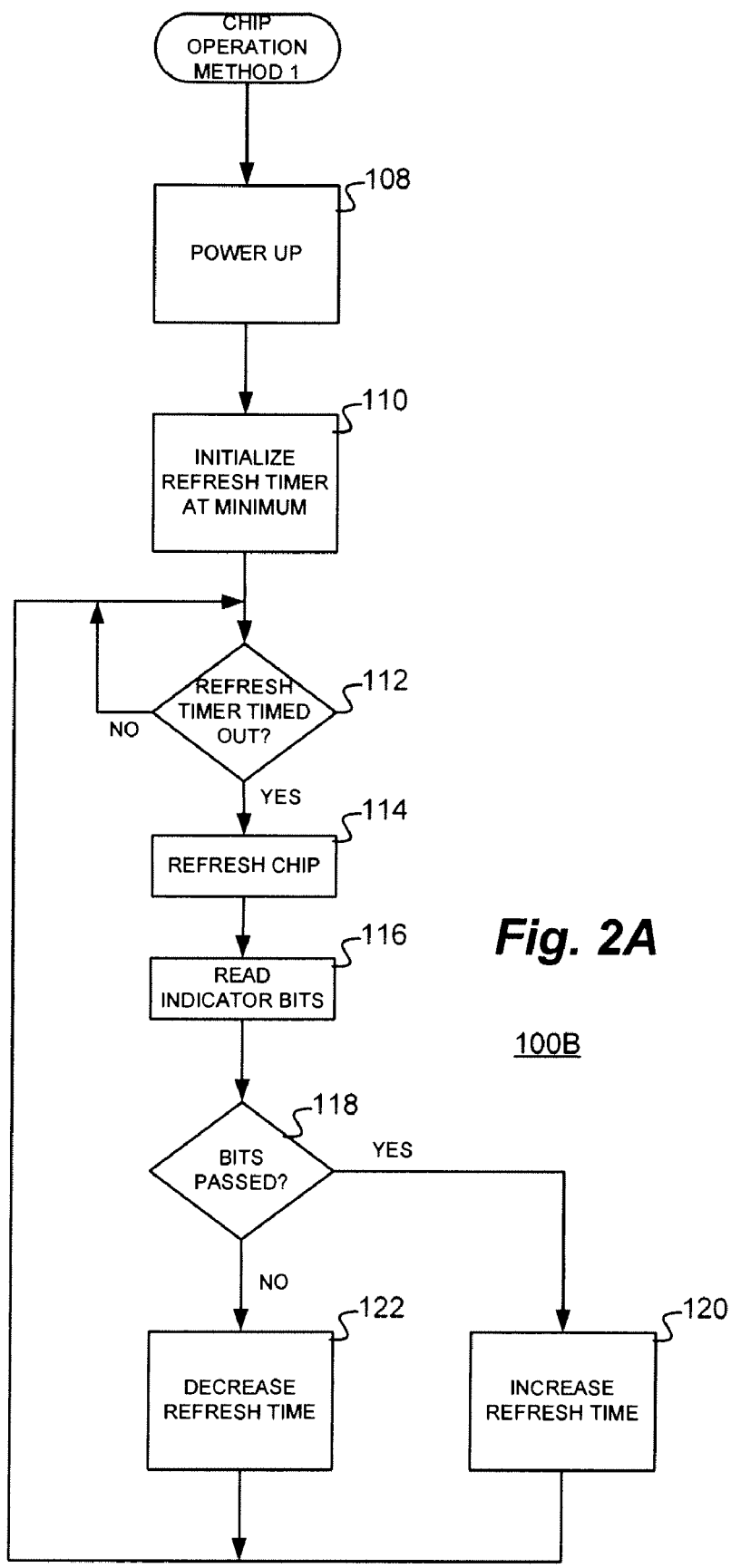
FIG. 2A is a representative flowchart for a chip operational method in conjunction with the test methodology of FIG. 1A.

With reference additionally now to FIG. 2A, a representative flowchart for a chip operational method 100B in conjunction with the test methodology 100A of FIG. 1A is shown.

The operational method 100B commences with DRAM array power up at step 108 followed by the initialization of the refresh time to a minimum interval at step 110. At decision step 112, the refresh timer is monitored to see if it has timed out and, if so, then the chip (or DRAM array) is refreshed at step 114. Following step 114, the indicator bits set in the preceding test methodology 100A (FIG. 1A) are read. If the bits pass at decision step 118, then the refresh time is increased at step 120. If the bits to not pass at decision step 118, then the refresh time is decreased at step 122. In either case, the chip operational method 100B then returns to implement decision step 112 once again.

Figure 2B:
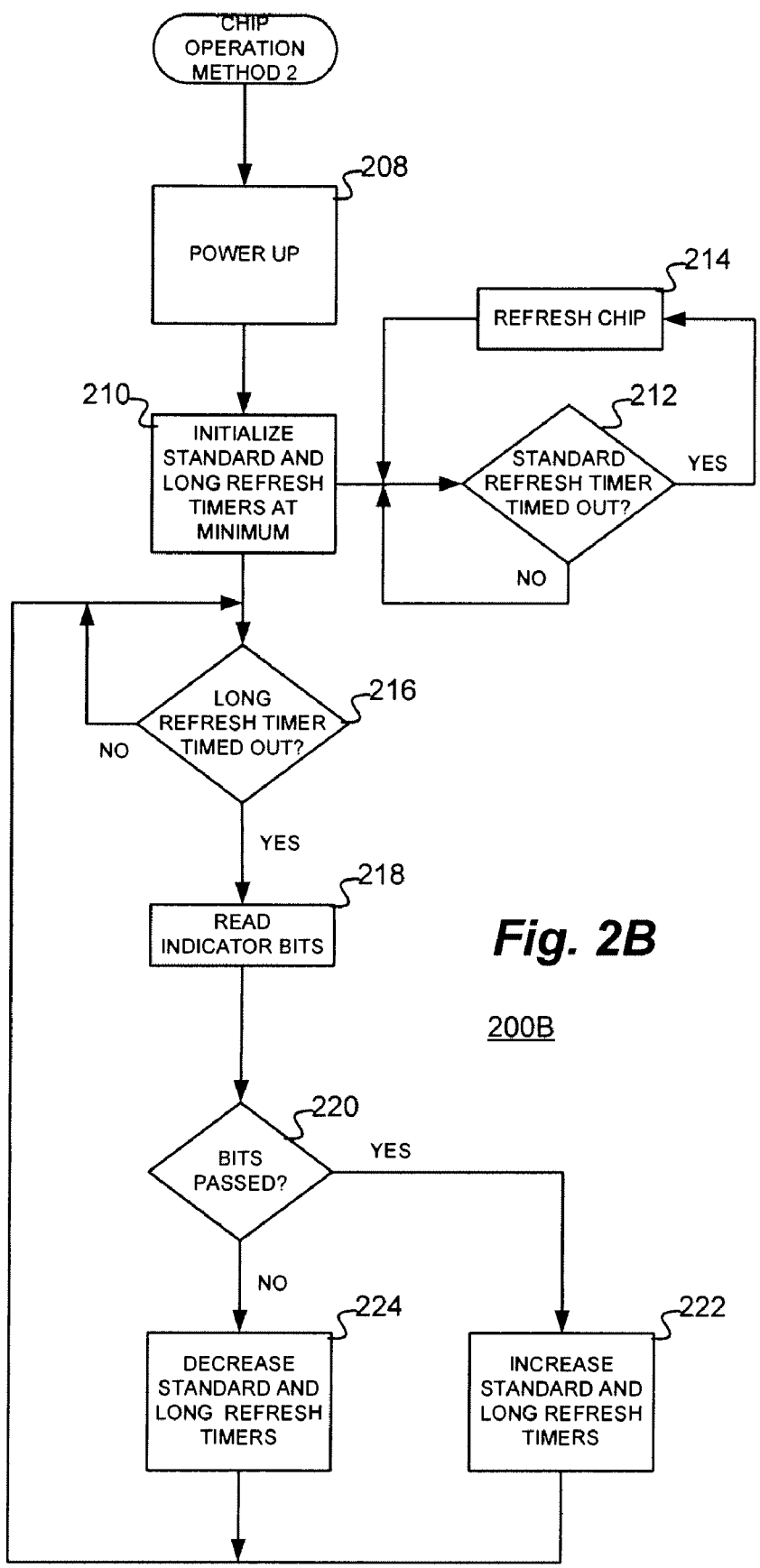
FIG. 2B is another representative flowchart for a further chip operational method in conjunction with the test methodology of FIG. 1B.

With reference additionally now to FIG. 2B, another representative flowchart for a further chip operational method 200B in conjunction with the test methodology 200A of FIG. 1B is shown.

The operational method 200B commences with DRAM array power up at step 208 followed by the initialization of standard and long refresh timers to a minimum interval at step 210. At decision step 212 the standard refresh timer is monitored to see if it has timed out and, if so, the chip (or DRAM array) is refreshed at step 214. In addition, the long refresh timer is monitored at decision step 216 to see if it has timed out and, if so, the indicator bits set in the chip operational method 200A (FIG. 1B) are read at step 218. At step 220, if the indicator bits have passed, then the interval for the standard and long refresh timers is increased at step 222.

Alternatively, if the indicator bits have not passed then the interval for the standard and long refresh timers is decreased at step 224. In either event, the operational method 200B then returns to implement decision step 216 once again.

While there have been described above the principles of the present invention in conjunction with specific process steps, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A DRAM array refresh period adjustment method comprising:
   determining a retention time of at least some of said DRAM array bits;
   replacing those DRAM array bits with the shortest retention time with spare bits; and
   establishing as indicator bits, one or more of those replaced DRAM array bits having a somewhat shorter retention time than any DRAM array bits not replaced.

2. The method of claim 1 further comprising:
   refreshing said DRAM array bits in accordance with a predetermined refresh time period;
   determining a state of said indicator bits; and
   increasing said refresh time period of said DRAM array bits to an increased refresh time period if said indicator bits have maintained their data state;
   decreasing said refresh time period of said DRAM array bits to a decreased refresh time period if said indicator bits have not maintained their data state.

3. The method of claim 2 further comprising:
   subsequently refreshing said DRAM array bits in accordance with either said increased or decreased refresh time period.

4. The method of claim 2 wherein said step of refreshing said DRAM array bits further comprises:
   initializing a refresh timer;
   setting said refresh timer to said predetermined refresh time period; and
   monitoring said refresh timer to determine when said predetermined refresh time period has elapsed.

5. A DRAM array refresh period adjustment method comprising:
   determining a retention time of at least some of said DRAM array bits;
   replacing those DRAM array bits with the shortest retention time with spare bits; and
   establishing as indicator bits, one or more of those replaced DRAM array bits having a substantially equal retention time to the not replaced DRAM array bits with the shortest retention time.

6. The method of claim 5 further comprising:
   refreshing said DRAM array bits in accordance with a first predetermined refresh time period;
   initializing a second longer predetermined refresh time period substantially concurrently with an initialization of said first predetermined refresh time period;
   determining a state of said indicator bits upon elapse of said second predetermined refresh time period; and
   increasing said first and second predetermined refresh time periods of said DRAM array bits to an increased refresh time period if said indicator bits have maintained their data state;
   decreasing said first and second predetermined refresh time periods of said DRAM array bits to a decreased refresh time period if said indicator bits have not maintained their data state.

7. The method of claim 6 further comprising:
   subsequently refreshing said DRAM array bits in accordance with either said increased or decreased refresh time period.

8. The method of claim 7 wherein said step of refreshing said DRAM array bits further comprises:
   initializing standard and long refresh timers;
   setting said standard refresh timer to said first predetermined refresh time period;
   setting said long refresh timer to said second longer predetermined refresh time period; and
   monitoring said standard and long refresh timers to determine when said respective first and second predetermined refresh time periods have elapsed.

9. A DRAM array refresh period adjustment method comprising:
   replacing selected ones of said DRAM array bits having a shortest retention time with spare DRAM array bits;
   utilizing at least one or more of said replaced DRAM bits having a retention time similar to the shortest retention time of said DRAM array bits not replaced as one or more indicator bits; and
   setting a refresh time period for said DRAM array based on said retention time of said one or more indicator bits.

10. The method of claim 9 further comprising:
    selecting said one or more indicator bits as those with a somewhat shorter retention time than said DRAM array bits not replaced.

11. The method of claim 9 further comprising:
    selecting said one or more indicator bits as those with a substantially similar retention time as said DRAM array bits not replaced.

* * * * *

UNITED STATES PATENT AND TRADEMARK OFFICE
CERTIFICATE OF CORRECTION

PATENT NO. : 7,515,494 B2 Page 1 of 1
APPLICATION NO. : 11/559791
DATED : April 7, 2009
INVENTOR(S) : Douglas B. Butler It is certified that error appears in the above-identified patent and that said Letters Patent is hereby corrected as shown below:

On the Title Page, Item (73) Assignee:

"ProMOS Technologies PTE.Ltd." should be --ProMOS Technologies PTE.LTD.--

Signed and Sealed this

Sixteenth Day of June, 2009

JOHN DOLL
*Acting Director of the United States Patent and Trademark Office*